(12) United States Patent
Leddige et al.

(10) Patent No.: US 6,708,243 B1
(45) Date of Patent: Mar. 16, 2004

(54) COMPUTER ASSEMBLY WITH STUB TRACES COUPLED TO VIAS TO ADD CAPACITANCE AT THE VIAS

(75) Inventors: Michael W. Leddige, Beaverton, OR (US); James A. McCall, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 535 days.

(21) Appl. No.: 09/724,634

(22) Filed: Nov. 28, 2000

(51) Int. Cl.[7] .............................. G06F 13/00; H05K 1/14
(52) U.S. Cl. ..................... 710/301; 361/763; 174/260
(58) Field of Search ........................ 710/301, 62, 300, 710/72; 709/253; 711/1; 326/101; 361/785, 679, 684, 760, 764, 763; 174/250, 262, 260; 439/489, 61, 631, 928

(56) References Cited

U.S. PATENT DOCUMENTS

| | | | | |
|---|---|---|---|---|
| 5,538,436 A | * | 7/1996 | Garney | |
| 6,067,594 A | | 5/2000 | Perino et al. | |
| 6,160,716 A | * | 12/2000 | Perino et al. | |
| 6,457,155 B1 | * | 9/2002 | Dell et al. | |
| 6,587,912 B2 | * | 7/2003 | Leddige et al. | |

* cited by examiner

*Primary Examiner*—Gopal C. Ray
(74) *Attorney, Agent, or Firm*—Mark V. Seeley

(57) ABSTRACT

A computer assembly is described. The computer assembly includes a motherboard and a socket mounted to the motherboard. The socket, which enables the motherboard to receive a memory card, has a mounting pin that is inserted into a via that is formed in the motherboard. A stub trace is coupled to the via to add capacitance at the via.

1 Claim, 2 Drawing Sheets

COMPUTER ASSEMBLY WITH STUB TRACES COUPLED TO VIAS TO ADD CAPACITANCE AT THE VIAS

FIELD OF THE INVENTION

The present invention relates to connections between printed circuit boards.

BACKGROUND OF THE INVENTION

Certain computer systems may employ a serial bus to transmit signals between a memory controller and memory. An example of such a serial bus has been defined by Rambus Corporation of Mountain View, Calif. That bus, often called the Direct Rambus memory channel, enables transmission of high speed, pipelined signals between a memory controller and memory. A memory card or module coupled to the bus may contain a number of high speed DRAMs, which have a Rambus developed architecture. Such memory devices are often called "Rambus DRAMs" or "RDRAMs."

The Direct Rambus memory channel may require signals to travel from a motherboard to a memory card. The memory card typically is inserted into a socket, which is mounted to the motherboard. That socket may introduce an impedance discontinuity into the signal line that could adversely affect system performance, e.g., by requiring reduction in the maximum frequency at which high speed, pipelined electrical signals may be driven along the channel—to prevent signal reflection that may degrade signal quality.

FIG. 1 represents a Direct Rambus memory channel, which shows memory cards 10 and 20 inserted into sockets 15 and 25, which have been mounted to a motherboard. Memory devices 5 are mounted onto cards 10 and 20. (Dashed boxes 6 serve to indicate that cards 10 and 20 may include memory devices in addition to those shown, which may be mounted to both sides of the cards. For example, as shown here, each memory card may include 16 memory devices—8 mounted to each side.) High speed, pipelined signals travel from memory controller 30 through cards 10 and 20 to termination resistors 35. As those signals travel from one end of the memory channel to the other, sockets 15 and 25 act as inductors. They also apply a small amount of capacitance to the signals that pass through them. The average impedance resulting from the combination of such a socket, vias located on both the motherboard and a memory card, and the memory card's edge fingers is a function of the socket's inductance and the sum of the capacitance that these elements apply. (The impedance may be estimated by taking the square root of that inductance divided by that sum.)

When the inductance that the socket provides is relatively high, the average impedance over the motherboard to memory card connection may be higher than desired, as it may cause a signal trace, which passes from the motherboard to the memory card, to experience an unwanted impedance discontinuity. Accordingly, there is a need for an improved connection between a motherboard and a memory card. There is a need for such a connection that reduces impedance discontinuity over a memory channel that is capable of transmitting high speed, pipelined signals. There is a need for such a connection that may be easily integrated into a computer assembly that is made with standard tools and components. The present invention provides such a connection.

DETAILED DESCRIPTION OF THE PRESENT INVENTION

A computer assembly is described. The computer assembly includes a motherboard and a socket that is mounted to the motherboard. The socket is capable of receiving a memory card that may be inserted into it. The socket has a mounting pin, which is inserted into a via that is formed in the motherboard. The computer assembly further includes a stub trace that is coupled to the via to add capacitance at the via. In the following description, numerous specific details are set forth such as component types, dimensions, etc., to provide a thorough understanding of the present invention. However, it will be apparent to those skilled in the art that the invention may be practiced in many ways other than those expressly described here. The invention is thus not limited by the specific details disclosed below.

Figure 1:
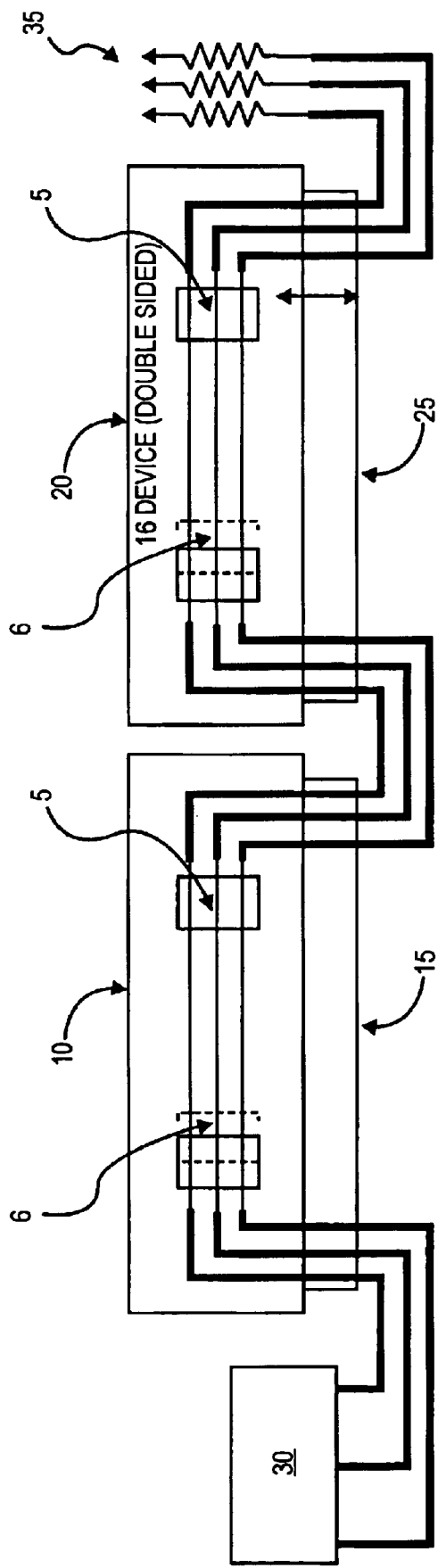
FIG. 1 represents a side view of a pair of memory cards inserted into a pair of sockets through which high speed, pipelined signals may be transmitted.
Figure 2:
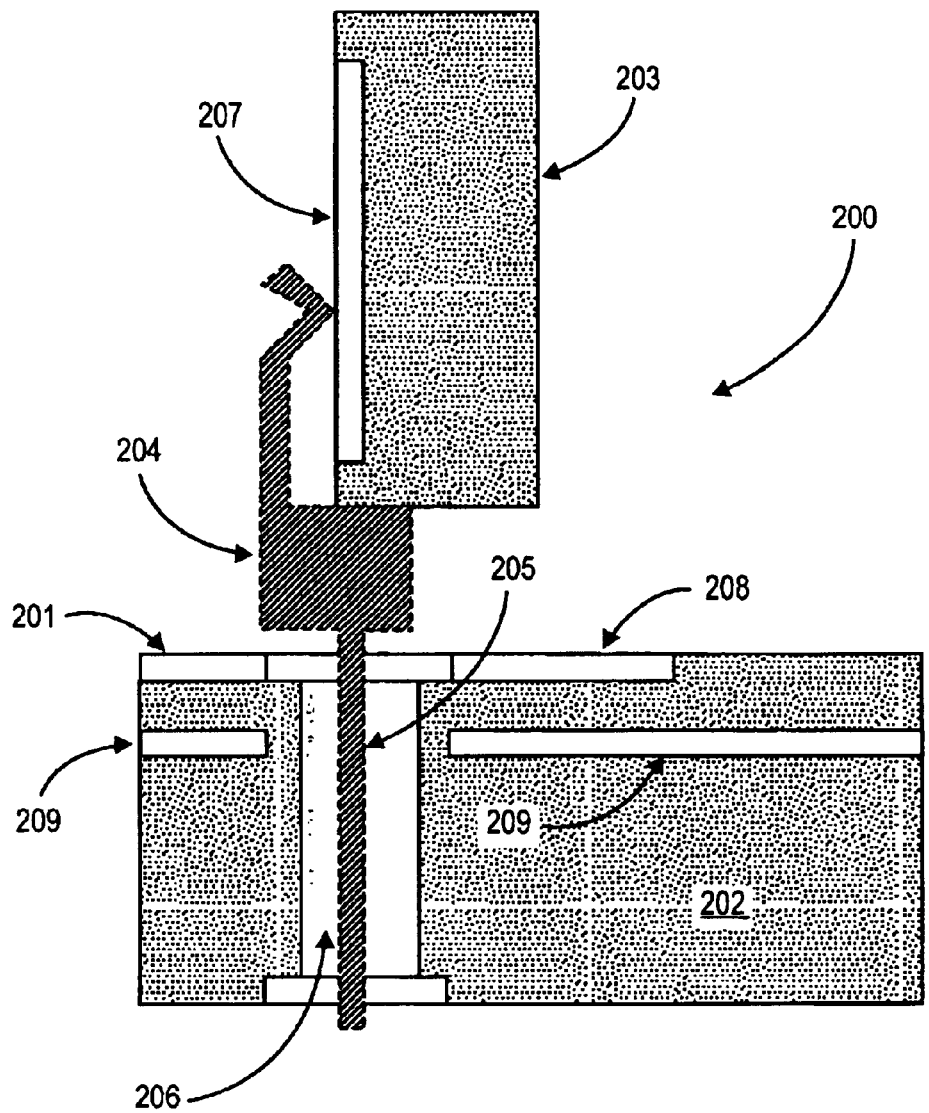
FIG. 2 represents a cross-section of an embodiment of the computer assembly of the present invention.

FIG. 2 represents a cross-section of computer assembly 200 that includes a high speed, pipelined memory channel. When used, that assembly causes signals to be transmitted along trace 201, which is formed on the surface of motherboard 202. Those signals pass from motherboard 202 to edge fingers 207, which are formed on memory card 203. Mounted to motherboard 202 is socket 204. Socket 204 is mounted to motherboard 202 by inserting mounting pin 205 into via 206 and applying an appropriate soldering step, as is conventionally done. Socket 204 makes electrical contact with edge fingers 207.

When standard components and tools are used to make the computer assembly of FIG. 2, the impedance of trace 201 may differ from the average impedance of the signal line as it extends from via 206 to edge fingers 207—through socket 204. As explained above, it is desirable to minimize any such discontinuity. To do so, the computer assembly of the present invention increases the capacitance at via 206 by forming on motherboard 202 a stub trace 208. (The amount of capacitance that stub trace 208 adds depends upon the amount of separation between stub trace 208 and ground plane 209. Similarly, the amount of capacitance via 206 adds to the signal line depends upon the amount of separation between the via and the ground plane.) In this embodiment, stub trace 208 is placed next to via 206 on the side opposite trace 201. In a preferred embodiment of the present invention, stub trace 208 adds between about 0.1 and about 1.5 picofarads of capacitance to the signal line.

It may be desirable to add a stub trace to memory card 203, in addition to adding stub trace 208 to motherboard 202. This may add capacitance or balance the amount of capacitance added to the motherboard/memory card connection across that connection. Such a stub trace (not shown) may be coupled to a via (not shown) that is associated with edge finger 207. Like stub trace 208, when such a stub trace is added to a via that is formed on memory card 203, that stub trace preferably adds between about 0.1 and about 1.5 picofarads of capacitance at the via. When stub traces are added to both motherboard 202 and memory card 203, they preferably apply, in combination, between about 0.2 and about 3.0 picofarads of capacitance to the signal trace. To assure acceptable performance, that added capacitance should be adjusted such that the overall electrical delay resulting from the presence of the stubs, the socket, the motherboard and memory card vias, and the edge finger is less than one-half of the signal rise time.

Figure 3:
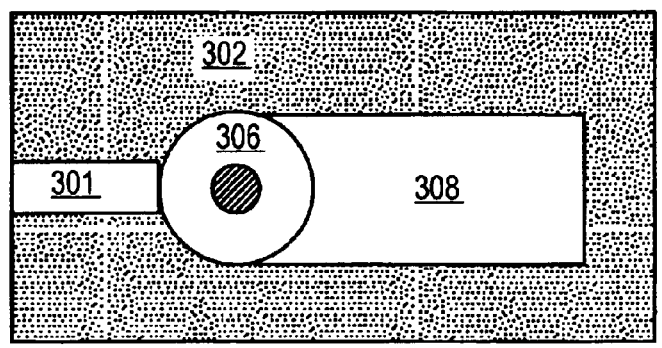
FIG. 3 represents a top view of a motherboard that may be used to make the computer assembly shown in FIG. 2.

FIG. 3 represents a top view of a motherboard that may be used to make the computer assembly shown in FIG. 2. Motherboard 302 includes via 306 (for receiving a socket's mounting pin), trace 301 and stub trace 308. Trace 301 is coupled to a first part of via 306's perimeter. Stub trace 308 is coupled to a second part of via 306's perimeter to add capacitance at the via. In this embodiment, stub trace 308 is located directly across the via from trace 301 and is rectangular in shape. Trace 301 and stub trace 308 may, however, assume a different orientation from the one depicted here. In addition, the particular shape of trace 308 is immaterial as long as it serves its intended function, i.e., adding capacitance at the via.

An improved connection for printed circuit boards has been described. That connection reduces any impedance discontinuity that may result from using standard tools and components to make a printed circuit connection that is included in a computer assembly, which provides a high speed, pipelined memory channel. Although the Direct Rambus memory channel is identified as potentially benefiting from use of the printed circuit board connection of the present invention, this connection may be used with other types of memory channels that are capable of transmitting high speed, pipelined signals.

Features shown in the above referenced drawings are not intended to be drawn to scale, nor are they intended to be shown in precise positional relationship. Additional features that may be integrated into the printed circuit board connection of the present invention have been omitted as they are not useful to describe aspects of the present invention. Although the foregoing description has specified a connection for printed circuit boards that includes certain features, those skilled in the art will appreciate that many modifications and substitutions may be made. Accordingly, it is intended that all such modifications, alterations, substitutions and additions be considered to fall within the spirit and scope of the invention as defined by the appended claims.

What is claimed is:

1. A computer assembly comprising:

a motherboard;

a socket mounted to the motherboard, the socket for receiving a memory card, the socket having a mounting pin that is inserted into a first via, which is formed in the motherboard;

a first stub trace coupled to the first via for adding capacitance at the first via;

a memory card that has been inserted into the socket and that includes an edge finger for making electrical contact with the socket, the memory card including a second via and a second stub trace that is coupled to the second via for adding capacitance at the second via; and a signal trace for transmitting signals between the motherboard and the memory card, the signal trace passing through the first via and the second via;

wherein the first stub trace adds between about 0.1 and about 1.5 picofarads of capacitance at the first via, and the second stub trace adds between about 0.1 and about 1.5 picofarads of capacitance at the second via;

wherein the combination of the first stub trace and the second stub trace applies between about 0.2 and 3.0 picofarads of capacitance to the signal trace; and wherein the signal propagation delay introduced by the combination of the first via, the socket, the edge finger, the second via, the first stub trace and the second stub trace is less than or equal to about one-half of the signal rise time.

* * * * *